(12) United States Patent
Sheng et al.

(10) Patent No.: US 11,837,448 B2
(45) Date of Patent: Dec. 5, 2023

(54) HIGH-TEMPERATURE CHAMBER AND CHAMBER COMPONENT CLEANING AND MAINTENANCE METHOD AND APPARATUS

(71) Applicant: Applied Materials, Inc., Santa Clara, CA (US)

(72) Inventors: Shuran Sheng, Saratoga, CA (US); Lin Zhang, San Jose, CA (US); Jiyong Huang, Rockwall, TX (US); Jang Seok Oh, San Ramon, CA (US); Joseph C. Werner, Santa Clara, CA (US); Nitin Khurana, Santa Clara, CA (US); Ganesh Balasubramanian, Fremont, CA (US); Jennifer Y. Sun, Mountain View, CA (US); Xinhai Han, Santa Clara, CA (US); Zhijun Jiang, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/242,059

(22) Filed: Apr. 27, 2021

(65) Prior Publication Data
US 2022/0344135 A1 Oct. 27, 2022

(51) Int. Cl.
*H01J 37/32* (2006.01)
*C23C 16/44* (2006.01)
*B08B 7/00* (2006.01)

(52) U.S. Cl.
CPC ...... *H01J 37/32862* (2013.01); *B08B 7/0035* (2013.01); *C23C 16/4405* (2013.01);
(Continued)

(58) Field of Classification Search
CPC .......... H01J 37/32862; H01J 37/32449; H01J 37/32724; H01J 2237/3321; H01J 2237/335; B08B 7/0035; C23C 16/4405
See application file for complete search history.

(56) References Cited

U.S. PATENT DOCUMENTS 7,479,191 B1 * 1/2009 Entley ................ B08B 7/0035 134/1
9,976,211 B2 5/2018 Firouzdor et al.
(Continued)

FOREIGN PATENT DOCUMENTS

JP 2011054825 A 3/2011
KR 20010021675 A * 3/2001 ............. C23C 16/44
(Continued)

OTHER PUBLICATIONS

Machine translation of KR-20010021675-A (Year: 2001).*
(Continued)

*Primary Examiner* — Erin F Bergner
(74) *Attorney, Agent, or Firm* — Patterson + Sheridan, LLP

(57) ABSTRACT

Examples disclosed herein relate to a method and apparatus for cleaning and repairing a substrate support having a heater disposed therein. A method includes (a) cleaning a surface of a substrate support having a bulk layer, the substrate support is disposed in a processing environment configured to process substrates. The cleaning process includes forming a plasma at a high temperature from a cleaning gas mixture having a fluorine containing gas and oxygen. The method includes (b) removing oxygen radicals from the processing environment with a treatment plasma formed from a treatment gas mixture. The treatment gas mixture includes the fluorine containing gas. The method further includes (c) repairing an interface of the substrate support and the bulk layer with a post-treatment plasma. The post-treatment plasma is formed from a post-treatment gas mixture including a nitrogen containing gas. The high temperature is greater than or equal to about 500 degrees Celsius.

22 Claims, 6 Drawing Sheets

(52) U.S. Cl.
  CPC .. *H01J 37/32449* (2013.01); *H01J 37/32724* (2013.01); *H01J 2237/335* (2013.01); *H01J 2237/3321* (2013.01)

(56) References Cited

U.S. PATENT DOCUMENTS

| | | |
|---|---|---|
| 10,002,745 B2 | 6/2018 | Zhang et al. |
| 10,734,202 B2 | 8/2020 | Sun et al. |
| 10,815,562 B2 | 10/2020 | Firouzdor et al. |
| 2014/0213016 A1 | 7/2014 | Sheng et al. |
| 2014/0363596 A1 | 12/2014 | Sun et al. |
| 2015/0299050 A1 | 10/2015 | Sun et al. |
| 2015/0311043 A1 | 10/2015 | Sun et al. |
| 2016/0296981 A1 | 10/2016 | Baluja et al. |
| 2017/0323772 A1 | 11/2017 | Fenwick et al. |
| 2018/0174901 A1 | 6/2018 | Wang et al. |
| 2019/0185999 A1* | 6/2019 | Shanbhag ........... C23C 16/4405 |
| 2019/0382889 A1 | 12/2019 | Parimi et al. |
| 2020/0370174 A1 | 11/2020 | Sheng et al. |

FOREIGN PATENT DOCUMENTS

| | | |
|---|---|---|
| KR | 100755804 B1 | 9/2007 |
| TW | I468364 B | 1/2015 |

OTHER PUBLICATIONS

International Search Report and Written Opinion for Application PCT/US2022/021515 dated Jun. 30, 2022.
Taiwan Office Action for Application No. 111114437 dated Sep. 20, 2023.

\* cited by examiner

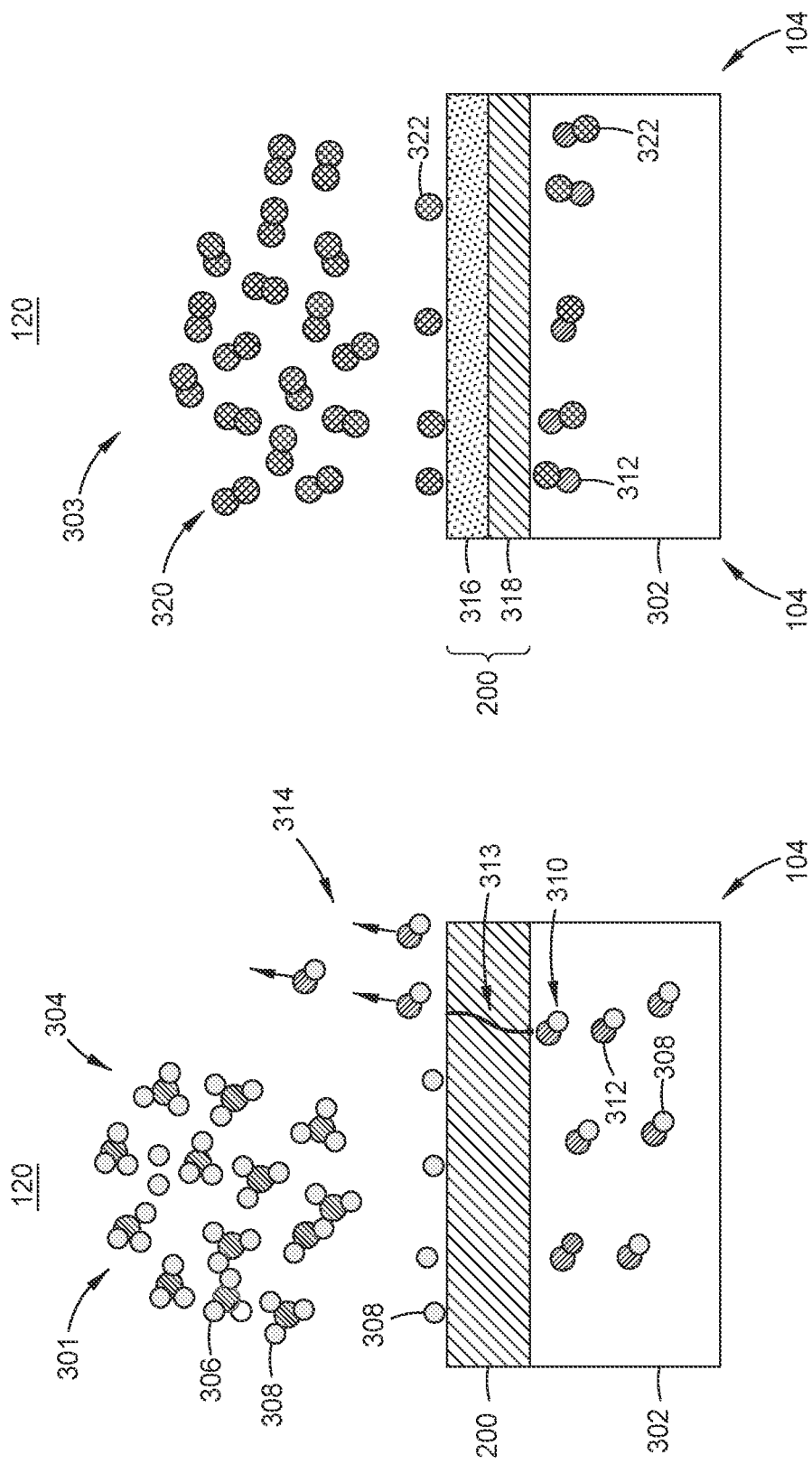

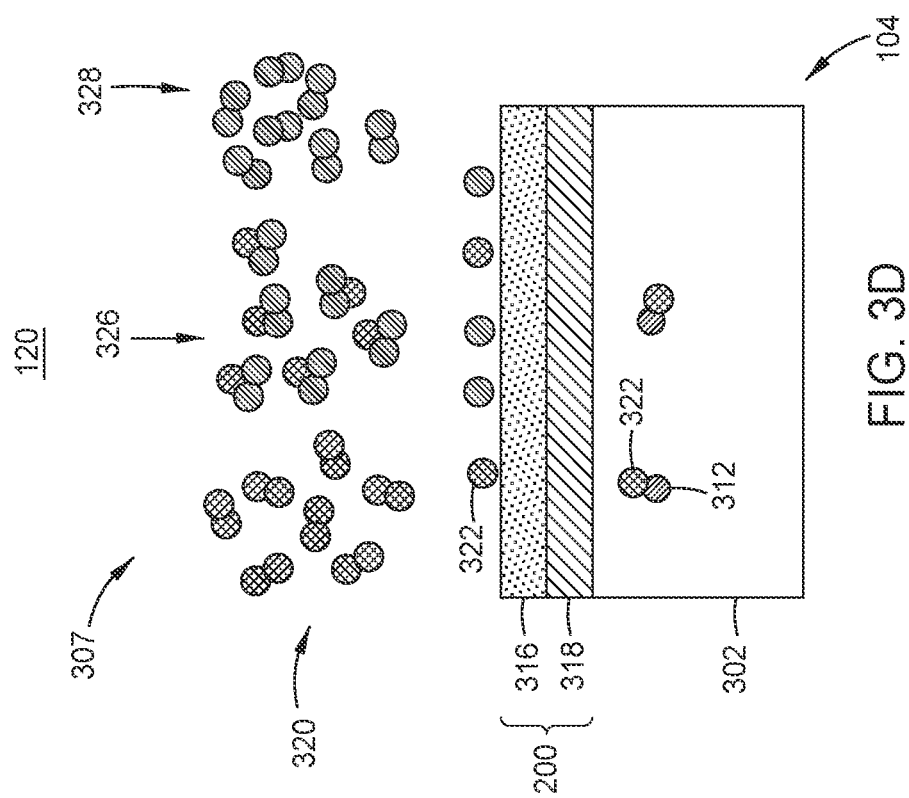
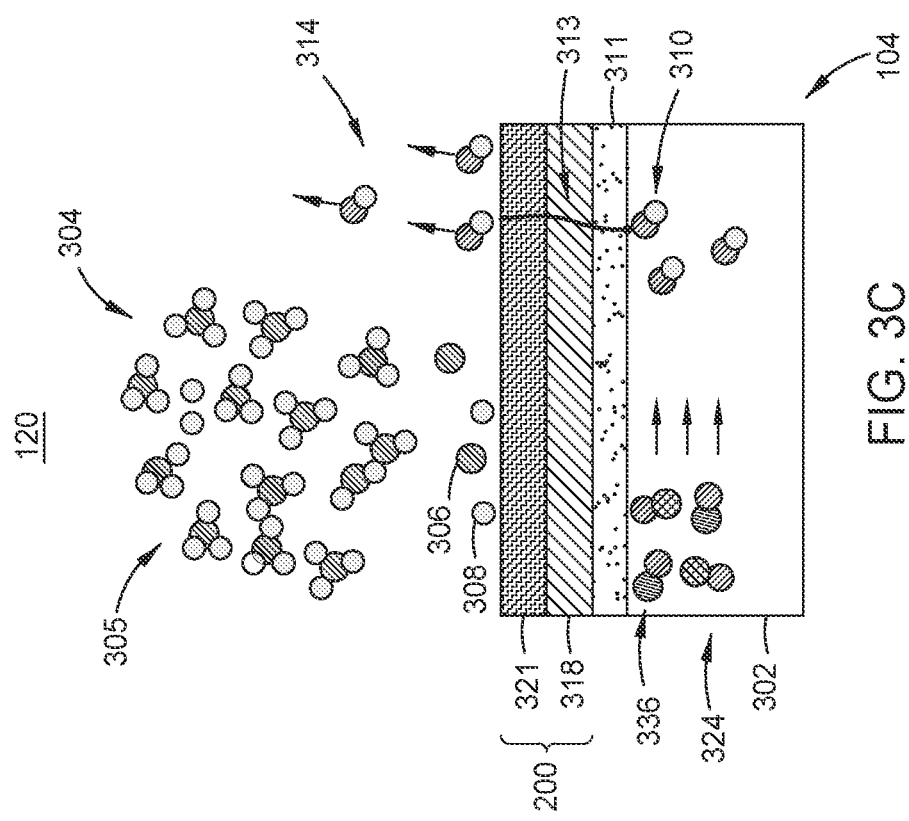

HIGH-TEMPERATURE CHAMBER AND CHAMBER COMPONENT CLEANING AND MAINTENANCE METHOD AND APPARATUS

BACKGROUND

Field

Examples of the present disclosure generally relate to an apparatus and method for cleaning and maintaining a process chamber or components inside the chamber, such as a heater disposed within a substrate support.

Description of the Related Art

High device yield and continuing mean wafer between clean (MWBC) gain and cost of ownership (CoO) reduction are key requirements for advanced semiconductor high volume manufacturing (HVM). Hence, more stringent controls are required for the semiconductor processing tools for particle defects and process stability or drifts as well as the chamber hardware longevity. During a chemical vapor deposition (CVD) process, the reactant gases can create compositions which deposit upon the inside surfaces of the chamber. As these deposits build up, the residues can flake off and contaminate future processing steps. Such residue deposits can also adversely affect other processing conditions such as deposition uniformity, deposition rate, film stress, particle performance, and the like.

Accordingly, processing chambers are periodically cleaned to remove the residue materials. The cleaning process involves a plasma enhanced dry cleaning technique. The etchant, typically a halogen or an oxygen containing gas, such as fluorine containing gas or oxygen gas, can react with the surfaces of the chamber components, such as the substrate support to form a fluoride or an oxide. In some applications, the substrate support is maintained at an elevated temperature, such as greater than 500 degrees Celsius. However, at the elevated temperature, the fluoride sublimates and condenses on chamber components that are at a lower temperature than the substrate support, for example the showerhead. The condensation can cause contamination of the substrates during CVD processes and can lead to changes in the CVD process conditions, such as deposition rate and uniformity drifting.

The conventional clean processes have temperature limits, lower than about 500° C. for the Carbon-based films, and lower than about 570° C. for the Si-based films, due to fluorine (F) radicals from RPS or RF plasma attacking the conventional AlN or $Al_2O_3$ heater surface. The F radicals can react with the substrate support, such as the heater surface, which could be sublimated at higher than about 500° C. and then condensed or redeposited on the colder surfaces, such as the face plate, chamber walls etc. This resulted in process drifts, particle issues and hence significant reduction of MWBC and increase of CoO, etc. The substrate support can be coated with a thin ceramic coating, which offers some resistance to the cleaning gases. However, the coating may be worn off as substrates are placed on and removed from the substrate support. Moreover, the coatings can be vulnerable to oxidization or degrade from radicals formed when plasma dissociates the cleaning gases. In addition, the size and complexity of substrate supports, and the edge rings that may be attached to the substrate supports, adds time and is more costly to maintaining the ceramic coating on the chamber components.

Therefore, an improved method and apparatus for performing high temperature cleaning of the chamber and its components and for protecting the coatings on chamber components is needed.

SUMMARY

Disclosed herein is a method and apparatus for cleaning the chamber and its components, such as a substrate support. In one example, a method includes: (a) cleaning a surface of a substrate support having a bulk layer disposed thereon. The substrate support is disposed in a processing environment configured to process substrates. The cleaning process includes forming a plasma at a high temperature, which may be the same as the film deposition temperature from a cleaning gas mixture. The cleaning gas mixture includes a fluorine containing gas and oxygen. The method includes (b) removing oxygen radicals from the processing environment at the high temperature with a treatment plasma formed from a treatment gas mixture. The treatment gas mixture includes the fluorine containing gas. The method further includes (c) maintaining, repairing, or restoring an interface of the substrate support and the bulk layer at the high temperature with a pre-treatment or post-treatment plasma. The pre-treatment or post-treatment plasma is formed from a nitrogen-containing gas mixture including a nitrogen containing gas. The high temperature is greater than or equal to about 500 degrees Celsius.

In another example, a method for cleaning a substrate support includes: (a) cleaning a surface of a substrate support having a bulk layer disposed thereon. The substrate support is disposed in a processing environment configured to process semiconductor substrates. The cleaning process includes forming a plasma at a high temperature from a cleaning gas mixture. The cleaning gas mixture includes $NF_3$ and $O_2$. The method further includes (b) removing oxygen radicals from the processing environment at the high temperature with a treatment plasma formed from a treatment gas mixture. The treatment gas mixture includes $NF_3$. The method continues by (c) maintaining, restoring or repairing an interface of the substrate support and the bulk layer at the high temperature with a pre-treatment or post-treatment plasma. The pre-treatment or post-treatment plasma is formed from a post-treatment nitrogen-containing gas mixture including $N_2$. The high temperature is greater than or equal to about 500 degrees Celsius.

In yet another example, a semiconductor processing system has a semiconductor processing chamber. The semiconductor processing system includes a non-transitory computer readable medium storing instructions. The instructions, when executed by a processor, cause a cleaning method to be performed in the semiconductor processing chamber. The method includes: (a) cleaning the surfaces of the chamber and its components, such as a surface of a substrate support having a bulk layer disposed thereon. The substrate support is disposed in a processing environment configured to process semiconductor substrates. The cleaning process includes forming a plasma at a high temperature from a cleaning gas mixture. The cleaning gas mixture includes fluorine containing gases or oxygen-containing gases, or any fluorine containing and oxygen-containing gases mixed therein. The method also includes (b) removing oxygen radicals from the processing environment at the high temperature with a treatment plasma formed from a treatment gas mixture. The treatment gas mixture includes the fluorine containing gases. The method further includes (c) maintaining, restoring or repairing an interface of substrate support and the bulk layer at the high temperature with a pre-treatment or post-treatment plasma. The pre-treatment or post-treatment plasma is formed from a post-treatment gas mixture that includes a nitrogen containing gases. The high temperature is greater than or equal to about 500 degrees Celsius.

BRIEF DESCRIPTION OF THE DRAWINGS

So that the manner in which the above recited features of the present disclosure can be understood in detail, a more particular description of the disclosure, briefly summarized above, may be had by reference to examples, some of which are illustrated in the appended drawings. It is to be noted, however, that the appended drawings illustrate only exemplary examples and are therefore not to be considered limiting of its scope, and may admit to other equally effective examples.

FIGS. 3A-3E are side views of a base and the bulk layer of the substrate support during different stages of a cleaning method.

To facilitate understanding, identical reference numerals have been used, where possible, to designate identical elements that are common to the figures. It is contemplated that elements and features of one example may be beneficially incorporated in other examples without further recitation.

DETAILED DESCRIPTION

Figure 1:
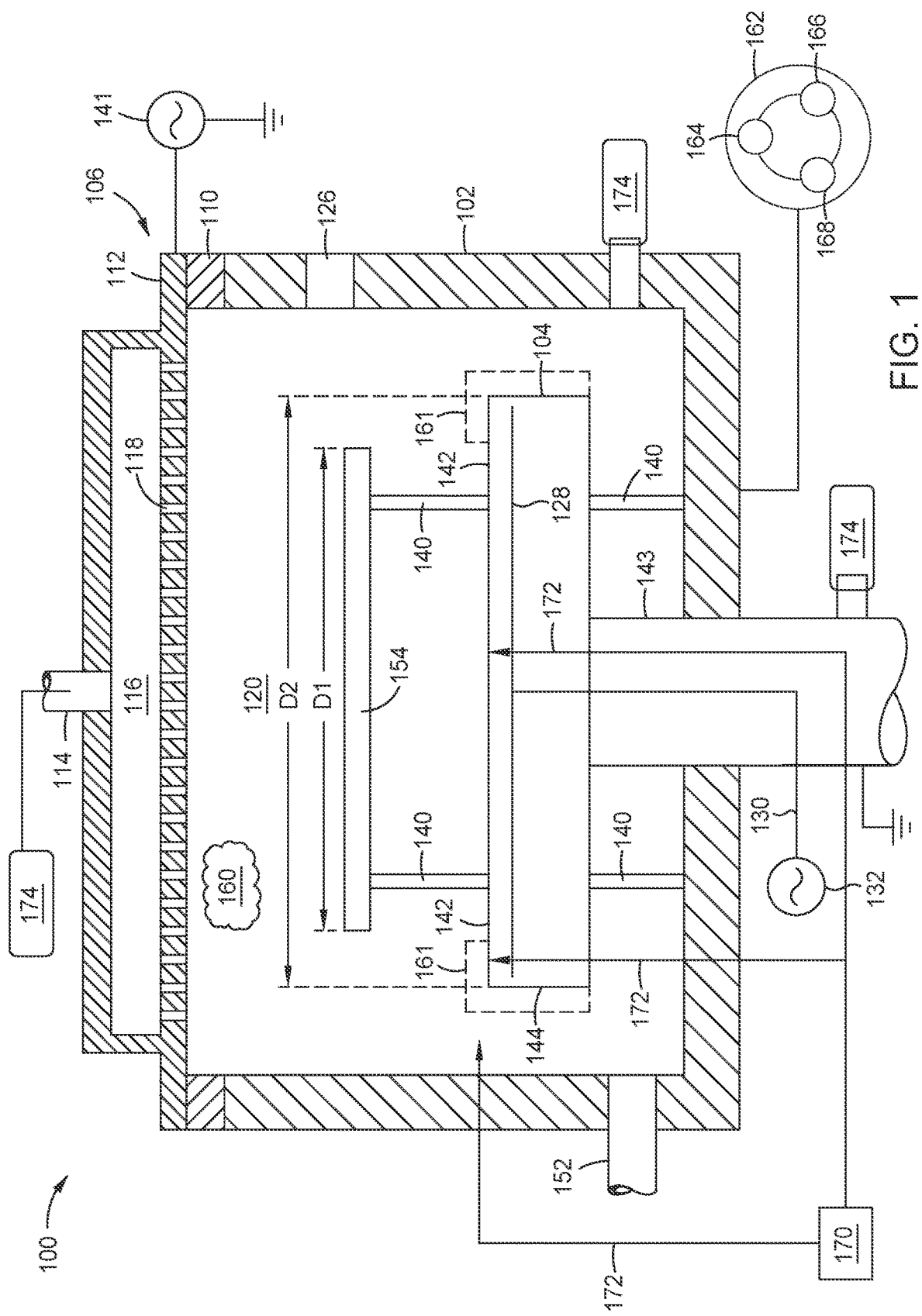
FIG. 1 is a schematic cross-sectional side view of a processing chamber.

Examples of the present disclosure generally relate to a method and apparatus for cleaning the chamber and its components, such as a substrate support. The substrate support may have a heater disposed therein. The substrate support is disposed within a processing chamber configured to process semiconductor substrates. In one example, a substrate support includes a heater coated with a bulk layer comprising fluoride. Advantageously, the bulk layer does not react with the cleaning species. Therefore, the bulk layer protects the substrate support from reacting with the cleaning species, leading to reduced condensation formed on chamber components. Consequently, the bulk layer leads to reduced contamination of the substrate in subsequent processes and prevents changes or drifts of the processing conditions.

In conventional cleaning methods and apparatuses, microvoids and micro-fissures often develop into cracks which damage the surface of the substrate support, and may propagate to the heater. Over the course of multiple cleaning cycles, cracks continue to grow within the heater until the cracks connect, thus weakening the adhesion between the bulk layer and the heater near the cracks. This localized loss of adhesion in the conventional cleaning method results in delamination of the bulk layer from the heater. Beneficially, the method of the instant disclosure reduces the formation of micro-fissures and voids that lead to cracks, thus extending the lifetime of the heater, or other chamber component coated with the bulk layer. Other chamber components that can be adapted to benefit from the disclosure include a cover wafer or, a ring within a process kit, such as an edge ring, among others.

In the conventional cleaning process with oxygen- or fluorine-based etchants, fluorine and oxygen radicals can damage an aluminum based heater disposed in a substrate support. The fluorine and oxygen radicals can cause the aluminum in the heater to convert to AlF, which is sublimated to the processing environment, and redeposited on chamber components. Conventionally, in order to clean carbon-based residue, a temperature of the processing environment is less than 500 Celsius, and for silicon-based films, the temperature is less than 570 Celsius. The conventional cleaning processes and gases do not use high temperatures, because the conventional processes etch away the heater and other chamber components. Left untreated, the damage caused to the heater can alter an impedance or capacitance of the substrate support, resulting process drift, or in an undesireable change in the plasma profile across the substrate support, or can generate particles leading to yield loss.

In one example of the disclosure, the high temperature method and apparatus is adapted to clean a substrate support that has a carbon-based film or residue thereon. A cleaning gas that includes fluorine can be used for silicon-based residue, and a cleaning gas that includes oxygen can be used for cleaning carbon-based residue. Advantageously, the method and apparatus herein enables operating temperatures above 500 degrees Celsius for carbon-based films, and greater than about 570 degrees Celsius for silicon-based films, such as between about 600 degrees and about 1000 degrees Celsius and even higher than 1000° C.

Fluorine or oxygen radicals produced in the RF or RPS plasma, or by thermal or laser energy, can diffuse through the bulk layer disposed on the heater. The bulk layer includes an $MgF_x$ compound, such as an $MgF_2$ layer. The fluorine radicals react with aluminum containing material in the heater, such as AlN. Upon reaction with the fluorine, the aluminum in the heater forms $AlF_x$ that diffuses through the bulk layer and sublimates into the processing environment of the processing chamber. The method disclosed herein, reduces or eliminates the reaction of fluorine radicals on the bulk layer overlaying the heater. Oxygen radicals can induce oxidation of the $MgF_x$ layer, thus forming MgO. Fluorine radicals can attack the $MgF_x$ and AlN interface to form $AlF_x$ and nitrogen oxide ($NO_x$). As $AlF_x$ and $NO_x$ diffuse out of the substrate support 104, micro-voids or fissures at interface of the $MgF_x$ and AlN can appear. Advantageously, the method reduces "eat off" of the AlN at an interface of the bulk layer and the heater, reducing the formation of micro-voids and micro-fissures at the interface. The method disclosed herein can also reduce cracks that form in the bulk layer. Cracks in the bulk layer can be caused by oxygen radicals interacting with the fluorine containing material in the bulk layer. For example, the oxygen radicals can reaction with $MgF_x$. Accordingly, plasms formed from a nitrogen trifluoride ($NF_3$) gas mixture treats the bulk layer after the cleaning process described above. A treatment process and a pre- or post-treatment process can involve etching, depositing, passivating or any combination of these techniques, to maintain, restore or repair weak sites or the degraded or damaged sites.

FIG. 1 is a schematic cross-sectional view of a processing chamber 100 according to one example described herein. The processing chamber 100 may be a plasma enhanced CVD (PECVD) chamber or other plasma enhanced processing chamber. An exemplary process chamber which may benefit from the examples described herein is the PRODUCER® series of PECVD enabled chambers, available from Applied Materials, Inc., Santa Clara, Calif. It is contemplated that other similarly equipped process chambers from other manufacturers may also benefit from the examples described herein. The processing chamber 100 includes a chamber body 102, a substrate support 104 disposed inside the chamber body 102, and a lid assembly 106 coupled to the chamber body 102 and enclosing the substrate support 104 in a processing environment 120. The lid assembly 106 includes a gas distributor, such as a showerhead 112. Substrates 154 are provided to the processing environment 120 through an opening 126 formed in the chamber body 102. While the disclosure herein directs the discussion to the substrate support 104, it is understood that the method and apparatus can be applied to any chamber component having the bulk layer, disclosed in detail below.

An isolator 110, which may be a dielectric material such as a ceramic or metal oxide, for example aluminum oxide and/or aluminum nitride, separates the showerhead 112 from the chamber body 102. The showerhead 112 includes openings 118 for admitting process gases or cleaning gases into the processing environment 120. The gases may be supplied to the process chamber 100 via a conduit 114, and the gases may enter a gas mixing region 116 prior to flowing through the openings 118. An exhaust 152 is formed in the chamber body 102 at a location below the substrate support 104. The exhaust 152 may be connected to a vacuum pump (not shown) to remove unreacted species and by-products from the processing chamber 100.

The showerhead 112 may be coupled to an electric power source 141, such as an RF generator or a DC power source. The DC power source may supply continuous and/or pulsed DC power to the showerhead 112. The RF generator may supply continuous and/or pulsed RF power to the showerhead 112. A remote plasma source 174 can also be coupled to a top, bottom, or side of the processing chamber 100, as shown. The electric power source 141 is turned on during the operation to supply an electric power to the showerhead 112 to facilitate formation of a plasma 160 in the processing environment 120. When exposed to plasma 160, constituents from the processing gases, including ions, neutrons, protons, and radicals are created when the processing gas(es) is disassociated by the application of RF generator or DC power source.

The substrate support 104 includes a surface 142 for supporting the substrate 154 and a side surface 144. In one example, the side surface 144 is substantially perpendicular to the surface 142. The substrate 154 has a dimension $D_1$ (e.g., a diameter), and the substrate support 104 has a dimension $D_2$ (e.g., a diameter), that is greater than the dimension $D_1$. The substrate support 104 may be formed from a ceramic material, for example a metal oxide or nitride or oxide/nitride mixture such as aluminum, aluminum oxide, aluminum nitride, or an aluminum oxide/nitride mixture. The substrate support 104 is supported by a shaft 143. The substrate support 104 may be grounded. A heating element 128 is embedded in the substrate support 104. The heating element 128 may be a plate, a perforated plate, a mesh, a wire screen, or any other distributed arrangement. The heating element 128 is coupled to a power source 132 via a connection 130. The heating element 128 can heat the substrate support to an elevated temperature, such as greater than 500 degrees Celsius. During application of the method and apparatus disclosed herein, the substrate 154 is not disposed within the processing environment 120.

The substrate support 104 shown in FIG. 1 is at a lower position, and the substrate 154 is supported by a plurality of lift pins 140 extending through the substrate support 104. The substrate 154 may be placed on the lift pins 140 or removed from the lift pins 140 by a robot (not shown) through the opening 126. During operation, the substrate support 104 raises to a higher position, and the substrate 154 is disposed on the surface 142.

During a cleaning process, a cleaning gas, for example a fluorine containing gas or an oxygen containing gas, may react with the substrate support 104 to form a fluoride or an oxide on the substrate support 104. The substrate support 104 is maintained at a temperature greater than 500 degrees Celsius. At such elevated temperate, the fluoride or oxide sublimates and condenses on cooler chamber components, such as the showerhead 112. Oxide sublimation temperature is high, e.g., alumina ($Al_2O_3$) sublimates between about 1150 degrees Celsius and about 1200 degrees Celsius. $AlF_x$ can be sublimated at greater than about 500 degrees Celsius. The condensation of materials on the showerhead 112 can cause contamination of the substrate during subsequent processes. Thus, the bulk layer 200 is utilized during application of the disclosed method and apparatus.

A purge gas source 170 is coupled to the chamber through one or more purge gas lines 172. As shown, the purge gas line 172 may pass through the chamber body 102 and supply purge gas to the surface 142 of the substrate support 104. The purge gas line 172 can also pass through the shaft 143 and the substrate support 104. As such, the purge gas line 172 can supply purge gas to the surface 142 though a center of the substrate support 104, and/or an edge of the substrate support 104 proximate the side cover 161.

At least one controller 162 is coupled to the processing chamber 100. The controller 162 includes a processor 164, a memory 166, and support circuits 168 that are coupled to one another. The processor 164 may be one of any form of general purpose microprocessor, or a general purpose central processing unit (CPU), each of which can be used in an industrial setting, such as a programmable logic controller (PLC), supervisory control and data acquisition (SCADA) systems, or other suitable industrial controller. The memory 166 is non-transitory and may be one or more of readily available memory such as random access memory (RAM), read only memory (ROM), or any other form of digital storage, local or remote. The memory 166 contains instructions, that when executed by the processor 164, facilitates execution of the method 400 (described below). The instructions in the memory 166 are in the form of a program product such as a program that implements the method of the present disclosure. The program code of the program product may conform to any one of a number of different programming languages. Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are examples of the present disclosure.

Figure 2A:
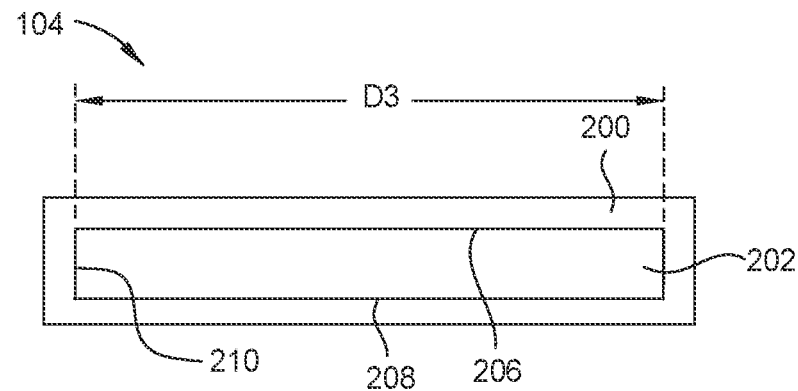
FIGS. 2A-2B are schematic side views of a substrate support having a bulk layer disposed thereon.
Figure 2B:
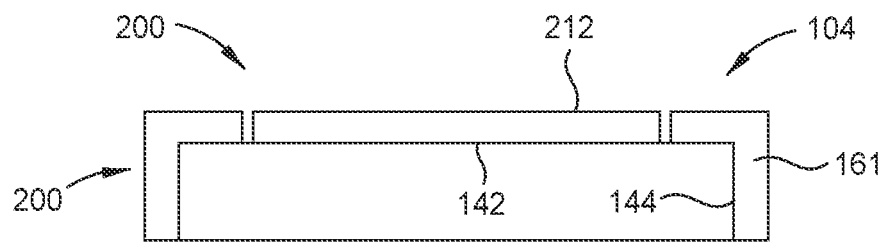

FIGS. 2A-2B are schematic side views of a substrate support 104 having a bulk layer 200 disposed thereon. The bulk layer 200 is disposed on a base 202 of the substrate support 104. The bulk layer 200 is a coating on the substrate support 104. As shown in FIG. 2A, the bulk layer 200 has a dimension $D_3$, for example a diameter, that is the same as the dimension $D_2$ of the substrate support 104. Thus, the bulk layer 200 convers the entire surface 142 of the substrate support 104. In some examples, bulk layer 200 has a dimension, such as a diameter, that is less than the dimension $D_2$ of the substrate support 104. For example, dimension $D_2$ can be the same as the dimension $D_1$ of the substrate 154. A portion of the surface 142 of the substrate support 104 may be exposed during the cleaning process, in some examples.

The base 202 includes a first surface 206 in contact with the bulk layer 200, a second surface 208 opposite the first surface 206, and a third surface 210 connecting the first surface 206 and the second surface 208. The second surface 208 is in contact with the surface 142 of the substrate support 104 during the cleaning process. The first surface 206 of the base 202 may be smooth. The bulk layer 200 covers the first surface 206, the second surface 208, and the third surface 210 of the base 202. As noted, in one example, the base 202 is the heating element 128 embedded within the substrate support 104

FIG. 2B illustrates an alternative example of a substrate support 104 having a cover plate 212 and the bulk layer 200 disposed thereon. In some examples, the substrate support 104 includes a cover plate 212 and the side cover 161. In one example, all sides of the cover plate 212 are covered with the bulk layer 200. In another example, the cover plate 212 is made of a same material as the bulk layer 200, such that the cover plate 212 can be composed of one or more stacked bulk layer(s) 200. The cover plate 212 covers the center portion of the surface 142 and the side cover 161 covers the edge portion of the surface 142 and the side surface 144. Additionally, each surface of the side cover 161 can be covered with the bulk layer 200. The side cover 161 may remain in the processing chamber 100 during a cleaning, as articulated in detail below. Each of the cover plate 212 and/or the side cover 161 may be made from the same material as the bulk layer 200, or alternatively a same material as the substrate support 104.

The bulk layer 200 can include a fluoride material, such as magnesium fluoride ($MgF_2$), or rare earth fluoride, for example yttrium fluoride ($YF_3$) or lanthanum fluoride ($LaF_3$). In one example, the bulk substrate support, including the heater, cover plate 212, and side cover 161, can be entirely made of a fluoride material having a thickness between about 500 microns and about 1500 microns. The fluoride material of the bulk layer 200 is exposed to the processing environment 120. In some examples, the fluorides are doped with a dopant, such as boron and/or carbon. The dopant level ranges from about 0 percent to about 50 percent, such as from about 10 percent to about 30 percent. In one example, the fluoride is boron and carbon doped $LaF_3$ ($LaF_3(B,C)$). The fluoride has substantially no reaction with the cleaning gases. Additionally, the fluoride of the bulk layer 200 does not sublimate at elevated temperatures, such as greater than 500 degrees Celsius or greater than 1000 degrees Celsius, fluorine in elemental form does not significantly leave the bulk layer 200 and enter the surrounding environment during high temperature cleaning. In one example, the cleaning temperatures between about 500 and about 750 degrees, such as between about 500 and about 650 degrees Celsius may be utilized while not causing significant amounts of fluorine in elemental form to leave the bulk layer 200. In one example, the bulk layer 200 is an $MgF_2$ or rare earth fluoride, such as $YF_3$, $LaF_3$, or $LaF_3(B,C)$, having a thickness ranging from about 100 microns to about 3000 microns, such as from about 500 microns to about 1500 microns.

The base 202 may be fabricated from silicon (Si), silicon dioxide ($SiO_2$), aluminum nitride (AlN), aluminum oxide (AlO), quartz, or other suitable material. The base 202 may be fabricated by any suitable method, such as sintering. The base 202 has a thickness ranging from about 100 microns to about 3000 microns, such as from about 500 microns to about 1500 microns. The bulk layer 200 may be fabricated using any suitable method, such as CVD, crystal growth, or sintering. The bulk layer 200 may be fabricated from PVD, PECVD, ALD, ion assisted deposition (IAD), plasma spray, wet coating, implantation, or plasma or laser based surface fluorination, boronization, and/or carbidation. The bulk layer 200 has a thickness ranging from about 1000 angstroms to about 10 microns, such as from about 5000 angstroms to about 1 micron. The bulk layer 200 is exposed to the processing environment 120 (shown in FIG. 1).

FIG. 3A shows the substrate support 104 disposed in processing environment 120. The substrate support 104 is exposed to a cleaning plasma, such as the plasma 160, which is produced from a cleaning gas mixture 301. As noted, plasma 160 can be generated by the RF source (e.g., electric power source 141) or RPS source 174. In one example, the bulk layer 200 includes a fluoride material, such as magnesium fluoride ($MgF_2$). The cleaning gas mixture 301 includes a fluorine containing gas 304. In one example, the fluorine containing gas 304 of the cleaning gas mixture 301 is $NF_3$, which contains nitrogen atoms 306 and fluorine atoms 308 that diffuse to the bulk layer 200 through some micro-fissures 313 into a heater 302. In the example shown, the heater 302 is made from an aluminum containing material, such as aluminum nitride (AlN). Aluminum atoms 312 in the AlN may react with the fluorine atoms 308 diffused through the micro-fissures 313 of the $MgF_2$ bulk layer 200 to form an aluminum fluoride ($AlF_x$) 310, or an $AlF_x$ gaseous phase 314. $AlF_x$ gaseous phase 314 diffuses out of the heater 302 and the bulk layer 200 of the substrate support 104. The $AlF_x$ gaseous phase 314 can be pumped out of the processing environment 120, or some may be condensed on the colder surfaces of the processing environment 120.

In one example, the cleaning gas mixture 301 can be a combination of oxygen ($O_2$) and $NF_3$, when carbon-based film or residue is present on the substrate support 104. In the presence of carbon, the cleaning gas mixture 301 can also be $NF_3$ and $N_2O$, or $N_2$. Oxygen radicals are controlled at levels without damaging oxidation on or attacking the chamber components when utilizing the cleaning gas mixture 301 to clean carbon-based film or residue. In another example, when silicon-based film or residue is deposited on the substrate support 104, the cleaning gas mixture 301 can include $NF_3$. The cleaning gas mixture 301 can also include $N_2$, $N_2O$, $NH_3$, or Ar. The fluorine containing gas 304 can include $NF_3$, $F_2$, $SF_6$, and the like. Alternatively, the cleaning gas mixture 301 can include an oxygen containing gas 320 such as oxygen, $N_2O$, $CO_2$. In one example, where silicon-based film or residue is present on the substrate support 104, and the heater 302 is made of AlN, the cleaning gas mixture 301 can include $NF_3$, $N_2$, or $NH_3$. In yet another example, where the heater 302 is made of AlO, the cleaning gas mixture 301 can include $NF_3$, $N_2O$, or $O_2$.

A second cleaning gas mixture 303 that includes oxygen ($O_2$) 320, is introduced into the processing environment 120, as shown in FIG. 3B. The substrate support 104 is exposed to a cleaning plasma, such as the plasma 160, is formed from the second cleaning gas mixture 303. Oxygen atoms 322 diffuses from the second cleaning gas mixture 303 into the bulk layer 200 forming a magnesium oxide (MgO) layer 316. Some of the magnesium fluoride ($MgF_2$) in the bulk layer 200 is converted to magnesium oxide (MgO). As shown, the bulk layer 200 includes the oxidized magnesium oxide ($MgO_x$) layer 316 and a clean protective layer 318.

Alternatively, the oxygen in the second cleaning gas mixture 303 can include a nitrogen containing gas 328. For example, oxygen can be replaced with $N_2O$ or $CO_2$, in presence of carbon-based film or residue. Residual $O_2$ radicals are reduced within the processing environment 120 during application of second cleaning gas mixture 303. For $O_2$ clean process, AlN in the heater 302 converts to AlO. Thermal conductivity of heater 302 reduces as AlO increases, and AlN decreases. The AlO and AlN convert to AlF and $AlF_x$ gaseous phase 314 can be pumped out of the processing environment 120. Introduction of $NF_3$ can advantageously remove oxygen radicals from the plasma, and thereby reduce the damage to the fluoro-magnesium layer ($MgF_x$) 321 by reducing the conversion of $MgF_x$ to $MO_x$. As such the $NF_3$ assist in reestablishing $MgF_2$ in the fluoro-magnesium layer ($MgF_x$) 321. In another example, fluorine radicals are removed from processing environment 120, when the second cleaning gas mixture 303 is applied to the processing environment 120 to clean silicon-based film or residue from the substrate support 104. In an example where the heater 302 is made of AlO, $N_2$ or $NH_3$ can be supplied in the second cleaning gas mixture 303.

FIG. 3C the exposure of the substrate support 104 to a post-treatment plasma (i.e., plasma 160) formed from a post-treatment gas mixture 305 that includes the fluorine containing gas 304. In one example, the fluorine containing gas 304 is $NF_3$. Nitrogen atoms 306 and fluorine atoms 308 diffuse to the substrate support 104. The Nitrogen atoms 306 and fluorine atoms 308 pass through the magnesium oxide (MgO) layer 316 (shown in FIG. 3B) and the clean protective layer 318. The magnesium oxide (MgO) is converted to a fluoro-magnesium layer ($MgF_x$) 321, where x is an integer between 1 and 6. Aluminum oxide (AlO) 336 and aluminum nitride (AlN) 324 in the heater 302 are converted to aluminum monofluoride (AlF) 310. The $AlF_x$ gaseous phase 314 diffuses out of heater 302 exiting the substrate support 104. In some example, the gaseous phase can include nitrogen oxide ($NO_x$), for example, when a carbon-based film is cleaned using oxygen-containing gases. Porous grains 311 form at an interface of the heater 302 and the bulk layer 200, such as interface of the heater 302 and fluoro-magnesium layer ($MgF_x$) 321. In one example, porous fluoro-magnesium ($MgF_x$) grains are the porous grains 311 that form at the interface of the heater 302 and fluoro-magnesium layer ($MgF_x$) 321. In FIG. 3C, the bulk layer 200 includes the clean protective layer and the 318 fluoro-magnesium layer ($MgF_x$) 321.

FIG. 3D illustrates a modification to the treatment operation shown in FIG. 3B. In FIG. 3D, an enhanced treatment gas mixture 307 is provided to the processing environment 120. The substrate support 104 is exposed to an enhanced treatment plasma formed when the plasma 160 is exposed to the enhanced treatment gas mixture 307. The substrate support 104 is exposed to a treatment plasma is formed from the enhanced treatment gas mixture 307. The enhanced treatment gas mixture 307 can include an oxygen containing gas 320, a nitrous oxide containing gas 326, or a nitrogen containing gas 328, or any combination thereof. For example, the enhanced treatment gas mixture 307 can contain only one of the oxygen containing gas 320, nitrous oxide containing gas 326, or the nitrogen containing gas 328. Alternatively, the enhanced treatment gas mixture 307 can contain the oxygen containing gas 320, and the nitrogen containing gas 328. In another example, the enhanced treatment gas mixture 307 can contain the nitrous oxide. In yet another example, enhanced treatment gas mixture 307 can be the nitrogen containing gas 328. The nitrogen containing gas 328 can actively suppress the influence of radicals formed by the RF or RP sources. Exemplary plasma radicals include radicals formed when oxygen ($O_2$) 320 or the fluorine containing gas 304 (e.g., $NF_3$), which are disassociated in plasma. The nitrogen containing gas 328 shields the substrate support 104, and any other components coated with the bulk layer 200. In some examples, the enhanced treatment gas mixture 307 is combined with the second cleaning gas mixture 303.

As noted, the nitrous oxide containing gas 326 can be used in lieu of the oxygen containing gas 320 shown in FIG. 3B. In one example, the nitrous oxide containing gas 326 is $N_2O$, which reduces oxidation of the substrate support 104. Alternatively, nitrogen ($N_2$) 328 and the oxygen containing gas 320 can be added to processing environment 120 to reduce surface oxidation of the substrate support 104. Advantageously, the presence of either one of the nitrogen containing gases, i.e., the nitrogen ($N_2$) 328 or nitrous oxide containing gas 326, increases the etch clean rate of the substrate support 104, as well as any surface covered by the bulk layer 200. In addition, $N_2$ or $NH_3$ removes residual fluorine radicals, repairs aluminum dangling bonds, and reduces conversion of $AlF_x$ to AlN, thus protecting the interface of the heater 302 and the bulk layer 200.

Figure 3E:
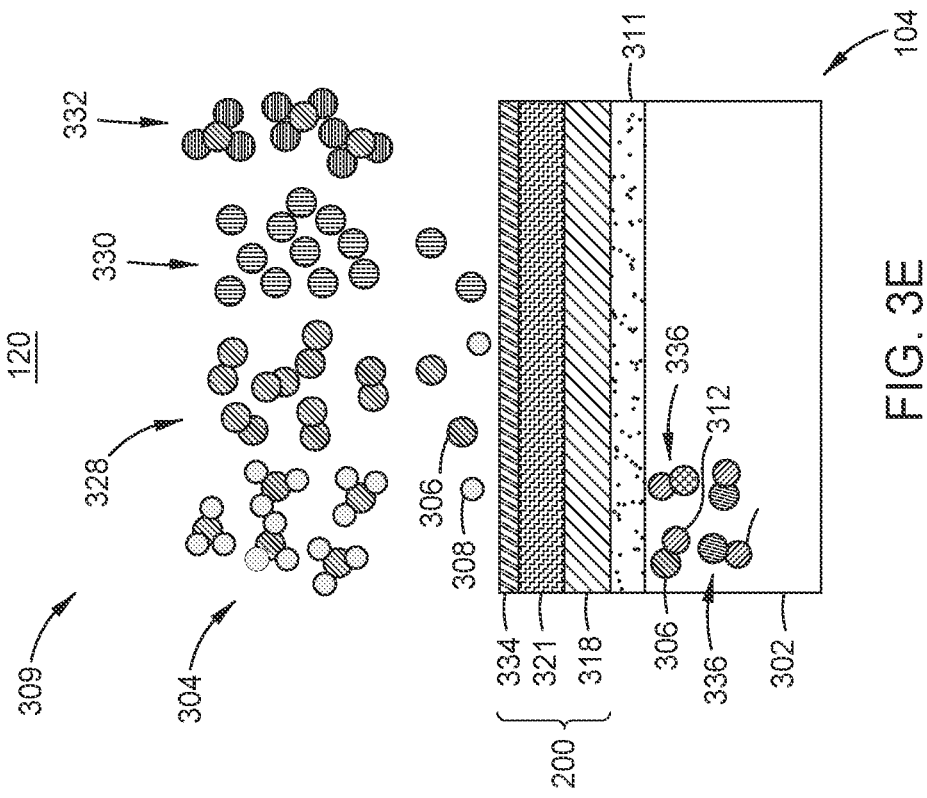

FIG. 3E illustrates a modification to the post-treatment operation shown in FIG. 3C. An enhanced post-treatment gas mixture 309 is provided to the processing environment 120 forming the plasma 160 as an enhanced post-treatment plasma. The substrate support 104 is exposed to a treatment plasma that is formed from the enhanced post-treatment gas mixture 309. The enhanced post-treatment gas mixture 309 can include the fluorine containing gas 304, the nitrogen containing gas 328, an argon containing gas 330, a hydrogen containing gas 332, or any combination of two or more thereof.

For example, the enhanced post-treatment gas mixture 309 can include the nitrogen containing gas 328 and an argon containing gas 330. The nitrogen containing gas 328 can form a barrier layer 334 that subdues oxidation of the heater 302. The barrier layer 334 includes also passivated barrier layers formed on the internal micro-crack surfaces, and the localized porous grans 311. During a treatment process shown in FIG. 3B or 3D, the argon containing gas 330 can repair and substantially eliminate weak grain boundaries within the heater 302. In another example, enhanced post-treatment gas mixture 309 includes nitrogen-containing gases, or hydrogen-containing gases, or Ar gas to eliminate weak sites (i.e. grain boundaries) before the barrier layer 334 or passivated barrier layers are formed. For example, an $NH_3$ or $H_2$ plasma treatment may remove oxidized layers by the oxidization-reduction reaction. Argon, and additional gases in the enhanced post-treatment gas mixture 309, can treat barrier layer 334 thus increasing resistance to oxygen and fluorine radicals.

In yet another example, the enhanced post-treatment gas mixture 309 includes the nitrogen containing gas 328, an argon containing gas 330, and a hydrogen containing gas 332. The hydrogen containing gas 332, in one example, is ammonium ($NH_3$). The enhanced post-treatment gas mixture 309 can enhance adhesion between the bulk layer 200 and the heater 302. The heater 302 (i.e., the base) is disposed within the substrate support 104 having the bulk layer 200 disposed on top of and in contact with the heater 302. The protective layer 200 includes the clean protective layer 318, the fluoro-magnesium layer ($MgF_x$) 321, and the barrier layer 334. Alternatively, the clean protective layer 318, fluoro-magnesium layer ($MgF_x$) 321, and the barrier layer 334 can form the bulk layer 200 when the nitrogen containing gas 328 is added to the of the enhanced post-treatment gas mixture 309.

Figure 4:
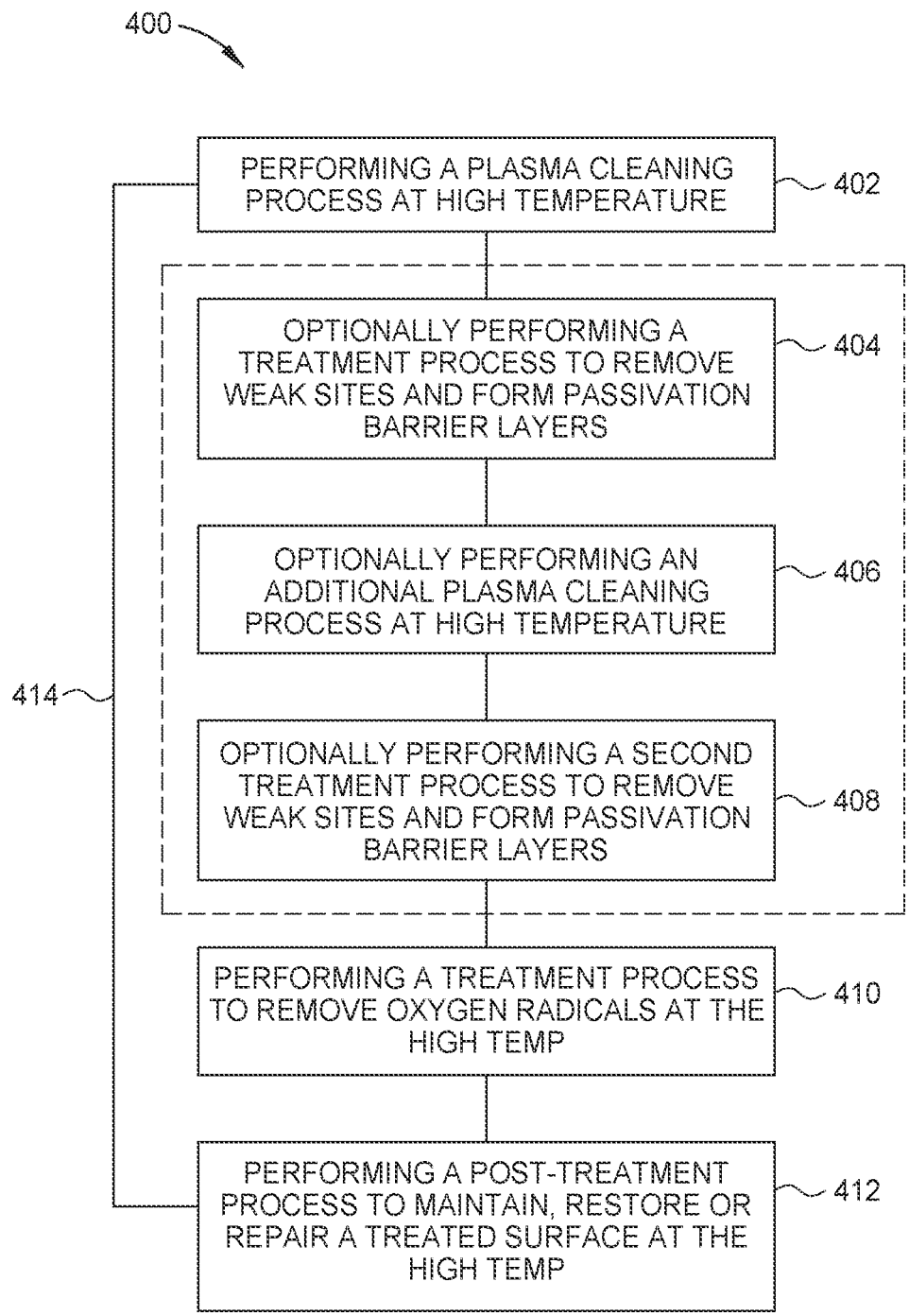
FIG. 4 is a flow chart illustrating a method for cleaning associated with the stages shown in FIGS. 3A-E.

FIG. 4 is a flow chart showing a method 400 for cleaning a chamber component. The chamber component may have the bulk layer 200 disposed thereon. The method 400 begins at operation 402 by performing a cleaning process in the processing chamber. The cleaning process may include flowing a cleaning gas, such as a fluorine containing gas or an oxygen containing gas, into the processing chamber. In some examples, the cleaning gas is first flowed into a remote plasma source (RPS) disposed over the processing chamber, and cleaning species, such as radicals, are formed in the remote plasma source. The cleaning species is then flowed into the processing chamber to perform the cleaning process. The chamber component may be maintained at a high temperature, for example between about 500 degrees Celsius and about 1000 degrees Celsius. Alternatively, the chamber component may be maintained at a high temperature of between about 550 degrees Celsius and about 850 degrees Celsius, such as between about 650 degrees Celsius and about 700 degrees Celsius. Optionally, a purge process with Argon or a nitrogen-containing gas, such as $N_2$ or $NH_3$ can be performed.

The cleaning gas or cleaning species removes any residue material built up on chamber components, such as the substrate support, the showerhead, edge or shadow ring (not shown), and/or chamber body. For example, the cleaning species can remove residue material from the substrate support 104 and the side cover 161, as shown in FIG. 1. The cleaning gas or cleaning species does not substantially react with the bulk layer, and the substrate support is protected from the cleaning gas or cleaning species by the bulk layer. As illustrated in FIG. 3A, the cleaning gas is a fluorine containing gas 304, in one example. The cleaning gas can also include nitrogen ($N_2$) 328 or the nitrous oxide containing gas 326, shown in FIG. 3D. In one example, nitrogen or argon may be introduced to the processing environment as a purge gas from the purge gas source 170. The introduction of nitrogen reduces surface oxidation of the substrate support from oxygen radicals. The nitrogen ($N_2$) purge may actively suppress impacts of the fluorine radicals or oxygen radicals formed within the plasma. An $N_2$ purge can suppress negative impacts of fluorine or oxygen radicals, particularly when silicon- and carbon-based film or residue are present on the substrate support 104. The $N_2$ purge can be implemented near the edge of heater 302, at the center of the heater 302, or through the heater 302, where fluoro-magnesium layer ($MgF_x$) 321 may be additionally weakened. An Ar purge reduces the presence of fluorine radicals in the processing environment 120, when carbon-based film or residue is deposited on the substrate support 104. When silicon-based film or residue is present on a chamber component, such as the substrate support 104, the Ar purge removes nitrogen, oxygen, or fluorine radicals from the processing environment 120. In yet another example, the Ar purge removes nitrogen oxide ($NO_x$) radicals from the processing environment 120.

The method 400 includes several optional operations. At operation 404, an optional pre-treatment process can be performed in order to substantially remove or eliminate weak sites and form passivation barrier layers. At operation 406, an additional high temperature plasma cleaning process can be optionally performed. For example, operation 402 can be repeated. The method may proceed to operation 408, where a second pre-treatment process can optionally be performed in order to remove weak sites and form passivation barrier layers.

At operation 410, the method 400 proceeds by performing a treatment process to remove oxygen radicals from the processing environment. The treatment process may be performed at a high temperature, such as the temperatures described above. As shown in FIGS. 3C and 3D, the substrate support 104 is exposed to plasma formed from the post-treatment gas mixture 305 or the enhanced treatment gas mixture 307. During operation 410, oxidation of the substrate support 104 is reduced by treatment gases that diffuse into the heater 302 from the post-treatment gas mixture 305, or the enhanced treatment gas mixture 307. A remote plasma source (RPS) can provide $NF_3$ or $O_2$, individually or in combination, to a processing environment, such as the processing environment 120. A location of the RPS can be coupled to a processing chamber at any location, such as a top, bottom, or center location of the processing chamber 100.

At operation 412, an optional post-treatment process is performed. The post-treatment process is performed to restore or repair a damaged surface or surfaces of the one or more cleaned chamber components. The chamber component can be damaged from oxidization of the surface from radicals in the plasma. The post-treatment process is performed at a high temperature, such as the temperatures described above. A plasma forms in the processing environment 120 from dissociating the post-treatment gas mixture 305, or the enhanced post-treatment gas mixture 309. As noted, the clean protective layer 318 and the fluoro-magnesium layer ($MgF_x$) 321 form the bulk layer 200, when the post-treatment gas mixture 305 is provided to the processing environment 120. Alternatively, when the enhanced post-treatment gas mixture 309 is provided, the barrier layer 334 may form on top of and in contact with the fluoro-magnesium layer ($MgF_x$) 321. Accordingly, the bulk layer 200 includes the barrier layer 334, the fluoro-magnesium layer ($MgF_x$) 321, and the clean protective layer 318. The enhanced post-treatment gas mixture 309 should reduce or eliminate the formation of the localized porous grains 311. In one example, the fluoro-magnesium layer ($MgF_x$) forms in the bulk layer 200. At operation 410, the method 400 can be repeated until a desired de-oxygenation level is reached in the heater 302, or and porous grains 311 which should be minimized or eliminated.

Disclosed herein is a method and apparatus for cleaning and optionally repairing or restoring process chamber components, such as a substrate support having a heater disposed therein. Advantageously, the bulk layer 200 fabricated from a fluoride material is utilized to protect the substrate support during a cleaning process. The fluoride-based bulk layer 200 has substantially no reaction with the cleaning gas or cleaning species, and no product is formed that can be sublimated as the substrate support is maintained at an elevated temperature. The elevated temperatures can be between about 500 degrees Celsius and about 1000 degrees Celsius. While the foregoing is directed to examples of the present disclosure, other and further examples of the disclosure may be devised without departing from the basic scope thereof.

What is claimed is:
1. A method, comprising:
(a) cleaning a surface of a substrate support having a bulk layer disposed thereon, the substrate support disposed in a processing environment configured to process substrates, wherein cleaning includes forming a plasma at a high temperature from a cleaning gas mixture, the cleaning gas mixture comprising a fluorine containing gas and oxygen;
(b) removing oxygen radicals from the processing environment at the high temperature with a treatment plasma formed from a treatment gas mixture, the treatment gas mixture comprising the fluorine containing gas; and
(c) repairing an interface of the substrate support and the bulk layer at the high temperature with a post-treatment plasma, the post-treatment plasma formed from a post-treatment gas mixture including a nitrogen containing gas, wherein the high temperature is greater than or equal to about 500 degrees Celsius.

2. The method of claim 1, wherein the bulk layer comprises magnesium fluoride or a rare earth fluoride.

3. The method of claim 1, wherein the bulk layer comprises yttrium fluoride, or lanthanum fluoride.

4. The method of claim 1, wherein the fluorine containing gas is $NF_3$, and wherein the nitrogen containing gas is $N_2$.

5. The method of claim 1, further comprising:
(d) purging the processing environment with the nitrogen containing gas or argon to reduce surface oxidation by the oxygen radicals, wherein the nitrogen containing gas is $N_2$ or $NH_3$.

6. The method of claim 1, further comprising:
(d) introducing $NF_3$, Ar, $NF_2$, or $NH_3$ to the processing environment with the post-treatment gas mixture to enhance adhesion between the bulk layer and a base disposed with the substrate support.

7. The method of claim 6, further comprising:
(e) introducing an argon containing gas to the processing environment with the post-treatment gas mixture.

8. The method of claim 1, wherein the substrate support further comprises:
a base, and the base comprises silicon, silicon dioxide, aluminum nitride, aluminum oxide, or quartz, and a fluoride material.

9. The method of claim 8, wherein the fluoride material comprises magnesium fluoride or a rare earth fluoride.

10. The method of claim 9, wherein the rare earth fluoride comprises yttrium fluoride, or lanthanum fluoride, and wherein the lanthanum fluoride is doped with boron and/or carbon, and the base is a heater.

11. A method, comprising:
(a) cleaning a surface of a substrate support having a bulk layer disposed thereon, the substrate support disposed in a processing environment configured to process semiconductor substrates, wherein cleaning includes forming a plasma at a high temperature from a cleaning gas mixture, the cleaning gas mixture comprising $NF_3$ and $O_2$;
(b) removing oxygen radicals from the processing environment at the high temperature with a treatment plasma formed from a treatment gas mixture, the treatment gas mixture comprising $NF_3$; and
(c) repairing an interface of the substrate support and the bulk layer at the high temperature with a post-treatment plasma, the post-treatment plasma formed from a post-treatment gas mixture including $N_2$, wherein the high temperature is greater than or equal to about 500 degrees Celsius.

12. The method of claim 11, wherein the bulk layer comprises magnesium fluoride or a rare earth fluoride.

13. The method of claim 11, wherein the bulk layer comprises yttrium fluoride, or lanthanum fluoride.

14. The method of claim 11, further comprising:
a heater comprising aluminum, wherein the heater is in contact with the bulk layer at the interface of the substrate support and the bulk layer.

15. The method of claim 11, further comprising:
(d) purging the processing environment with an argon or a nitrogen containing gas to reduce surface oxidation by the oxygen radicals, wherein the nitrogen containing gas is $N_2$ or $NO_2$, $NH_3$.

16. The method of claim 15, further comprising:
(d) introducing $NF_3$, Ar, $NF_2$, or $NH_3$ to the processing environment with the post-treatment gas mixture to enhance adhesion between the bulk layer and a base disposed with the substrate support.

17. The method of claim 16, further comprising:
(e) introducing an argon containing gas to the processing environment with the post-treatment gas mixture.

18. A semiconductor processing system, comprising:
a semiconductor processing chamber; and
a non-transitory computer readable medium storing instructions, the instructions when executed by a processor cause a method to be performed in the semiconductor processing chamber, the method comprising:
(a) cleaning a surface of a substrate support having a bulk layer disposed thereon, the substrate support disposed in a processing environment configured to process semiconductor substrates, wherein cleaning includes forming a plasma at a high temperature from a cleaning gas mixture, the cleaning gas mixture comprising a fluorine containing gas and oxygen;
(b) removing oxygen radicals from the processing environment at the high temperature with a treatment plasma formed from a treatment gas mixture, the treatment gas mixture comprising the fluorine containing gas; and
(c) repairing an interface of substrate support and the bulk layer at the high temperature with a post-treatment plasma, the post-treatment plasma formed from a post-treatment gas mixture including a nitrogen containing gas, wherein the high temperature is greater than or equal to about 500 degrees Celsius.

19. The semiconductor processing system of claim 18, further comprising:
(d) purging the processing environment with the nitrogen containing gas to reduce surface oxidation by the oxygen radicals, wherein the nitrogen containing gas is $N_2$ or $NH_3$.

20. The semiconductor processing system of claim 18, further comprising:
(d) introducing $NF_3$, Ar, $NF_2$, or $NH_3$ to the processing environment with the post-treatment gas mixture to enhance adhesion between the bulk layer and a base disposed with the substrate support; and
(e) introducing an argon containing gas to the processing environment with the post-treatment gas mixture.

21. The method of claim 1 wherein the high temperature is greater than or equal to 500 degrees Celsius.

22. The method of claim 11 wherein the high temperature is greater than or equal to 500 degrees Celsius.

* * * * *